United States Patent [19]
Zamanian et al.

[11] Patent Number: 6,153,458
[45] Date of Patent: Nov. 28, 2000

[54] METHOD OF FORMING A PORTION OF A MEMORY CELL

[75] Inventors: Mehdi Zamanian, Carrollton; James Leon Worley, Flower Mound, both of Tex.

[73] Assignee: STMicroelectronics, Inc., Carrollton, Tex.

[21] Appl. No.: 08/438,015

[22] Filed: May 8, 1995

Related U.S. Application Data

[62] Division of application No. 08/222,329, Apr. 4, 1994, Pat. No. 5,521,401, which is a continuation of application No. 07/934,181, Aug. 21, 1992, abandoned.

[51] Int. Cl.$^7$ .............................................. H01L 21/8244
[52] U.S. Cl. ........................ 438/238; 438/241; 438/268; 438/270
[58] Field of Search ...................... 437/52, 60, 47, 437/915; 257/903–904; 438/238–256, 381–384, 268–273

[56] References Cited

U.S. PATENT DOCUMENTS

| | | | |
|---|---|---|---|
| 3,584,412 | 6/1971 | Hodges | 257/69 |
| 4,146,902 | 3/1979 | Tanimoto et al. | 257/381 |
| 4,322,821 | 3/1982 | Lohstroh et al. | 307/317.2 |
| 4,558,343 | 12/1985 | Ariizumi et al. | 257/393 |
| 4,622,575 | 11/1986 | Vora et al. | 257/51 |
| 4,653,025 | 3/1987 | Minato et al. | 365/154 |
| 5,041,884 | 8/1991 | Kumamoto et al. | 257/401 |
| 5,103,276 | 4/1992 | Shen et al. | 357/23.6 |
| 5,106,775 | 4/1992 | Kaga et al. | 437/52 |
| 5,112,765 | 5/1992 | Cederbaum et al. | |
| 5,134,581 | 7/1992 | Ishibashi et al. | 257/49 |
| 5,162,889 | 11/1992 | Itomi | 257/69 |
| 5,210,429 | 5/1993 | Adan | 365/154 |
| 5,330,927 | 7/1994 | Lee | 437/52 |

FOREIGN PATENT DOCUMENTS 04234165  8/1992  Japan ..................... 257/302

OTHER PUBLICATIONS

Takato, H. et al., "Impact of Surrounding Gate Transistor (SGT) for Ultra–High–Density LSI's," IEEE Transactions on Electron Devices, vol. 38, No. 3, Mar. 1991.

*Primary Examiner*—Jey Tsai
*Attorney, Agent, or Firm*—Theodore E. Galanthay; Lisa K. Jorgenson; Dan Venglarik

[57] ABSTRACT

The invention may be incorporated into a method for forming a vertically oriented semiconductor device structure, and the semiconductor structure formed thereby, by forming a first transistor over a portion of a substrate wherein the first transistor has a gate electrode and a source and drain regions. First and second interconnect regions are formed over a portion of the gate electrode and a portion of the source and drain regions of the first transistor, respectively. A source and drain region of a second transistor is formed over the second interconnect. A Vcc conductive layer is formed over a portion of the source and drain region of the second transistor which is formed over the second interconnect.

20 Claims, 3 Drawing Sheets

METHOD OF FORMING A PORTION OF A MEMORY CELL

This is a Division of application Ser. No. 08/222,329, U.S. Pat. No. 5,521,401 filed Apr. 4, 1994, which is a continuation of application Ser. No. 07/934,181, filed Aug. 21, 1992, now abandoned.

FIELD OF THE INVENTION

The present invention relates generally to semiconductor integrated circuit processing, and more specifically to a vertically oriented memory cell.

BACKGROUND OF THE INVENTION

The manufacturing costs of integrated circuits are largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions.

With circuit advancement to the very-large-scale integration (VLSI) levels, more and more layers are added to the surface of the wafer. With these additional layers, the geometries and sizes of the active components are determined in part by the photolithography used to establish the horizontal dimensions of the various devices and circuits. The goal is to create a pattern which meets design requirements as well as to correctly align the circuit pattern on the surface of the wafer. Planarization techniques are generally incorporated to offset the effects of a varied topography to achieve the photolithography goals.

In addition to the planarization techniques used to increase photolithographic resolution, the chip area also depends on the isolation technology used. Sufficient electrical isolation must be provided between active circuit elements so that leakage current does not cause functional or specification failures. Increasingly stringent specifications, together with the demand, for example, for smaller memory cells in denser memory arrays, places significant pressure on the isolation technology in memory devices, as well as in other modern integrated circuits.

The size of a memory cell in a memory array also depends upon the particular devices used in the memory cell. The basic SRAM cell, for example, can be formed using cross-coupled CMOS inverters having 2 each n-channel and p-channel transistors. The cell is accessed by, typically, 2 n-channel control gates for a standard SRAM cell and 4 control gates for 2-port memory devices. To conserve physical layout space, the p-channel transistors are often replaced with resistive loads.

Vertical orientation of the various devices used in a memory cell may also achieve additional packing density in VLSI devices. For example, a surrounding gate transistor (SGT) may allow for higher packing densities over the planar transistor counterpart. The SGT, where the gate electrode is arranged vertically around a pillar of silicon, has a source and drain in the pillar and substrate and uses the sidewall of the pillar as the channel. The channel length thus depends upon the height of the pillar and can be changed without changing the occupied area of the transistor. A vertical orientation of the remaining devices within the memory cell in conjunction with the SGT will reduce the area required even further.

It is therefore an object of this invention to provide a method of forming a vertically oriented memory cell which allows for increased packing density by reducing the area required to build the cell while maintaining the electrical integrity and performance of the cell.

It is a further object of this invention to provide such a method which utilizes conventional process flows.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby, by etching a substrate to form a first and a second pillar. First and second surrounding gates are formed adjacent to the pillars. First and second interconnects are formed, wherein the first interconnect is formed over the first pillar and the second interconnect is formed over the second pillar. First and second pass transistors are formed, wherein the source/drain regions of the first pass transistor are formed over the first interconnect and the source/drain regions of the second pass transistor are formed over the second interconnect. First and second load resistors are formed wherein the first load resistor is formed over the source/drain regions of the first pass transistor and the second load resistor is formed over the source/drain regions of the second pass transistor.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
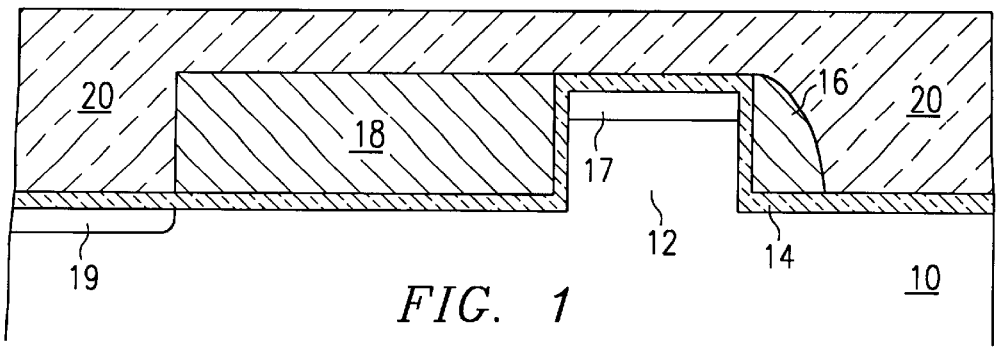
FIGS. 1–7 are cross sectional views of the fabrication of a semiconductor integrated circuit according to the present invention.

Referring to FIG. 1, an integrated circuit is to be formed on a silicon substrate 10. The silicon is patterned and a pillar or island 12 of silicon is formed from the substrate by etching away the silicon substrate from around the area where the pillar or island is to remain. A gate oxide layer 14 is formed over the substrate and along the sidewalls and on top of the pillar 12. A polysilicon layer is formed over the gate oxide layer 14 and pillar 12. This polysilicon layer is then etched back to form a gate electrode shown as regions 16 and 18. This cross section indicates how the single gate electrode surrounds the pillar 12. The gate electrode also surrounds the pillar outside the plane of the drawing. An illustration of the formation of the surrounding gate transistors is described in "Impact of Surrounding Gate Transistor (SGT) for Ultra-High-Density LSI's" by Hiroshi Takato et al, in Transactions On Electron Devices, Vol. 38, No. 3, March 1991. For ease of illustration, reference will be made only to 18 as the gate electrode. The polysilicon gate 18, the pillar 12 and the substrate are then implanted with an N-type dopant to form an N+ polysilicon gate and N+ source/drain regions 17 and 19. The n-channel transistor thus comprises the gate electrode 18, gate oxide 14, pillar 12 comprising source/drain regions 17, 19 and a channel region and the substrate.

Alternatively, polysilicon layer 18 may be a deposited N+ polysilicon. An implant is then made into the pillar 12 and source/drain regions 17, 19 to achieve the required dopant level in these elements of the device transistor. A first dielectric layer 20 is then formed over the polysilicon gate 18 and the pillar 12 to separate these areas from subsequent layers. Dielectric layer 20 is a grown or deposited oxide having a thickness of between approximately 500–10000 angstroms. The silicon substrate 10 and source/drain regions 19 thus act as the Vss ground bus.

Figure 2:
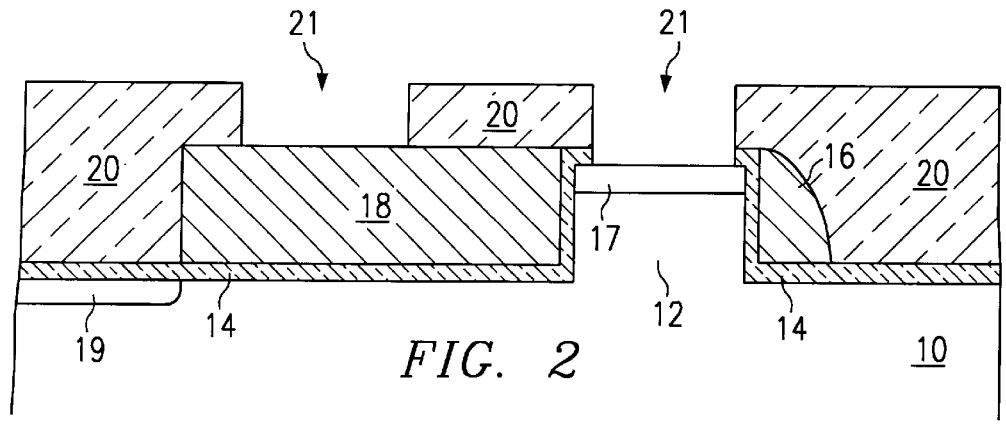

Referring to FIG. 2, an opening 21 is etched, preferably by an anisotropic etch, to expose a portion of the source/drain region 17 in pillar 12 and a portion of the polysilicon gate 18. These openings will allow connections to be made to this transistor through the gate 18 and source/drain region 17.

Figure 3:
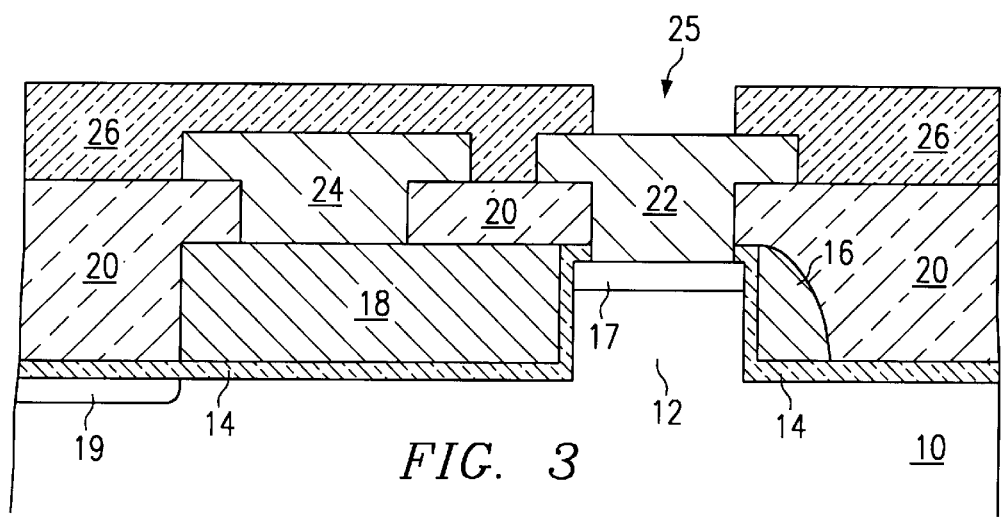

Referring to FIG. 3, a conductive layer is formed over the integrated circuit, patterned and etched to form interconnects 22 and 24 in the openings 21. In the preferred embodiment, these interconnects are formed from N+ deposited polysilicon to form an ohmic contact to the underlying areas. Alternatively, the polysilicon interconnects may be implanted. Interconnect 22 forms an ohmic contact to the source/drain region 17 and interconnect 24 forms an ohmic contact to the polysilicon gate 18. A second dielectric layer 26 is then formed over the integrated circuit. Dielectric layer 26 is a grown or deposited oxide having a thickness of between approximately 500–2000 angstroms. An opening 25 is formed in the second dielectric layer 26 to expose a portion of the interconnect 22 disposed over the source/drain region 17 in pillar 12.

Figure 4:
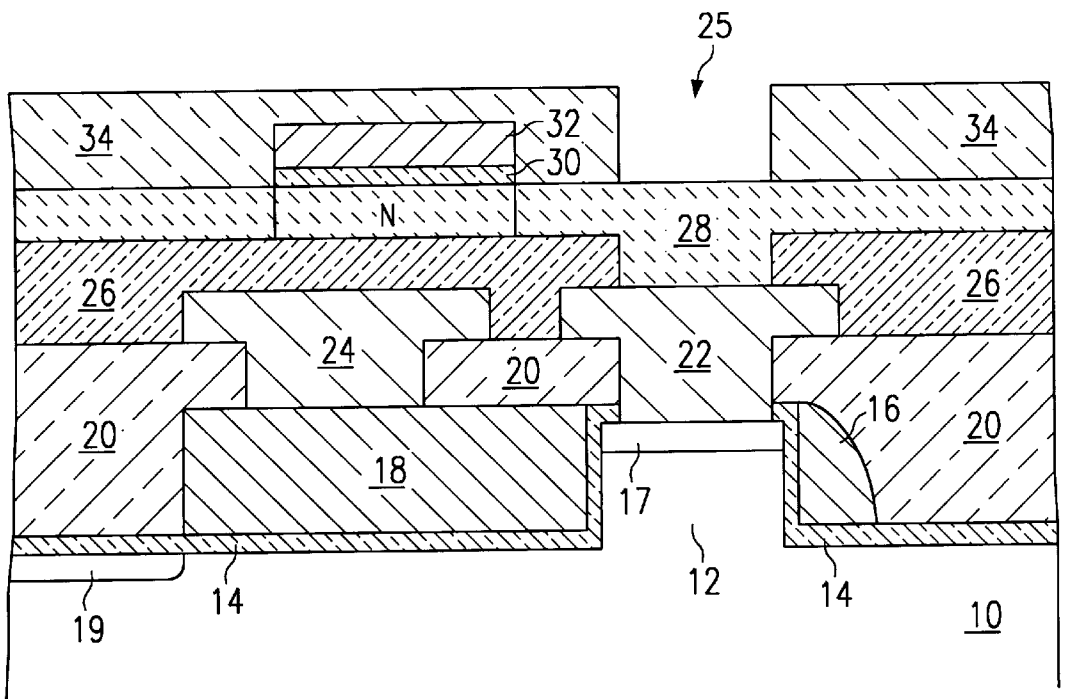

Referring to FIG. 4, a polysilicon layer 28 is formed over the dielectric layer 26 and in the opening 25. The polysilicon layer 28 is preferably a deposited N-type layer. An oxide layer is formed over the polysilicon layer 28 and a polysilicon layer is formed over the oxide layer. The oxide layer and upper polysilicon layer are patterned and etched by conventional methods to form a gate oxide layer 30 and a polysilicon gate electrode 32. Polysilicon gate electrode is preferably a deposited P or N-type layer. The polysilicon layer 28 is then implanted with a P-type dopant. The channel region under the gate electrode 32 remains N-type, as represented by the N. Polysilicon layer 28 then becomes the source/drain and channel region for a thin film transistor comprising gate electrode 32, gate oxide 30 and polysilicon layer 28. A portion of the source/drain 28 of the thin film p-channel transistor is physically located over the N-type interconnect 22 which is disposed over the pillar 12. A third dielectric layer 34 is formed over the polysilicon layer 28 and gate electrode 32. An opening is then formed in the dielectric layer 34 over opening 25. Alternatively, the gate electrode 32 may be formed underneath the source/drain layer 28 by forming a polysilicon layer and patterning and etching the layer to form the electrode. Layer 28 would then be formed over the electrode and appropriately doped to form the source, drain and channel regions of the thin film transistor.

Figure 5:
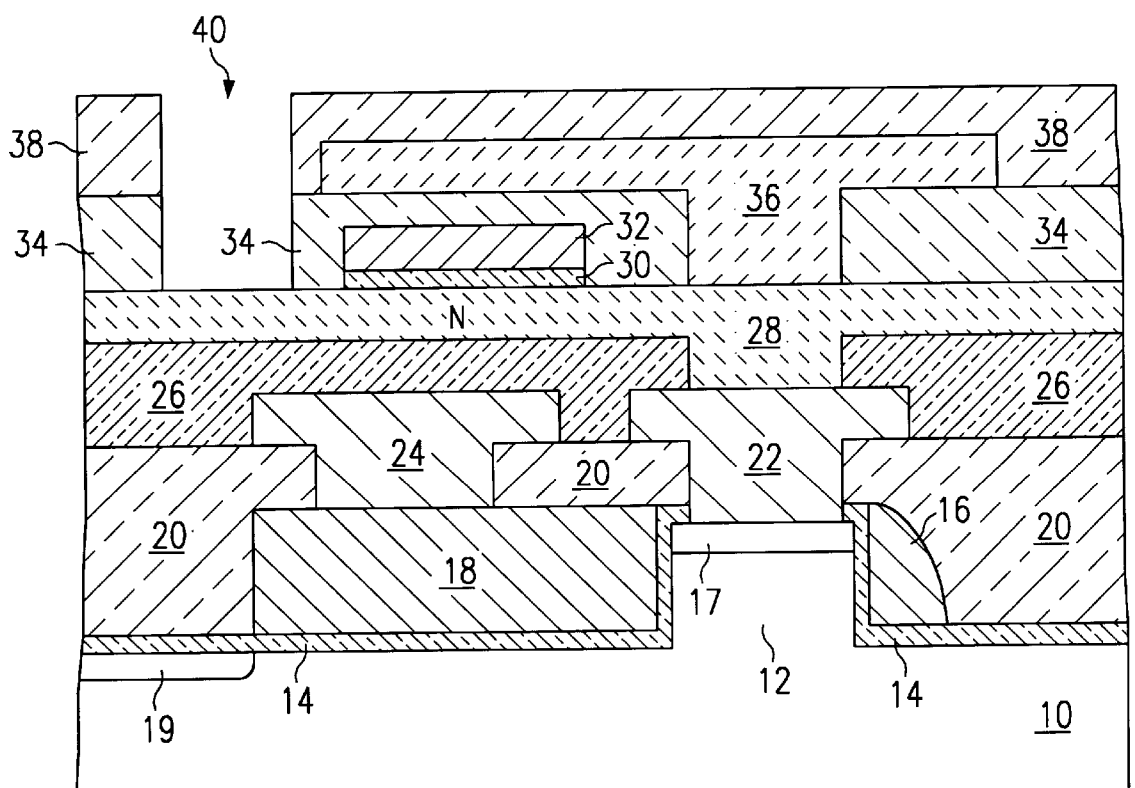

Referring to FIG. 5, a conductive layer 36 is formed over the dielectric layer 34 and in the opening 25 in dielectric layer 34. Layer 36 is preferably an N-type deposited or implanted polysilicon layer. Alternatively, layer 36 may be a deposited P-type layer which is then appropriately doped N-type. Layer 36 is then patterned and etched to form the power bus, such as a Vcc signal line, and an interconnect to the source/drain region of polysilicon layer 28. Layer 36 forms a part of the resistive load which is the reverse-biased p/n junction between layer 36 and the source/drain region 28. A portion of layer 36 is formed over the interconnect 22 and pillar 12. A fourth dielectric layer 38 is formed over the polysilicon layers 36 and 28. Layer 38 is a grown or deposited oxide layer having a thickness of between approximately 1000–10000 angstroms. An opening 40 is then formed in dielectric layer 38 and 34 to expose a portion of the source drain region 28 of the p-channel thin film transistor. The various dielectric layers 20, 26, 34 and 38 may also be a planarizing film/dielectric composite layer such that an upper portion of the composite layer can promote planarization of the wafer's surface before subsequent layers are formed. For example, the composite layer may be a spin-on-glass layer disposed over an oxide layer wherein the spin-on-glass promotes planarization of the surface.

One alternative to the above described invention which also uses a positive Vcc power supply provides for an n-channel thin film transistor instead of the p-channel transistor. The thin film transistor comprising gate electrode 32, gate oxide 30 and source/drain and channel regions in layer 28 will form the n-channel transistor. Thus, the channel region will remain P-type after the source and drain regions are implanted with a N-type dopant. Layer 36, which forms the Vcc signal line will then be a deposited or implanted P-type layer. P-type layer 36 will be heavily doped by a low energy N-type implant so that the contact to layer 28 remains P-type while an upper portion of layer 36 is N-type to form the resistive element of the load device at positive voltage.

A second alternative which utilizes an opposite power supply configuration wherein layer 36 acts as the Vss ground bus and the silicon substrate 10 and source/drain regions 19 act as the Vcc power supply. This alternative incorporates a p-channel surrounding gate transistor as well as the p-channel thin film transistor. In this alternative, the polysilicon gate 18, pillar 12 and the substrate are implanted with a P-type dopant to form a P-type gate electrode and P-type source and drain regions 17 and 19. Interconnect 22 will then be a P-type deposited or implanted polysilicon to form an ohmic contact to the source/drain region 17. Layer 36, which forms the Vcc signal line will be N-type polysilicon which is then implanted with a low-energy P-type dopant to form the reverse biased P/N junction within layer 36 which acts as the resistive load device.

A third alternative which also utilizes this opposite power supply configuration which comprises a p-channel surrounding gate transistor, P-type interconnect 22, n-channel thin film transistor with its source/drain region in layer 28 and a P-type polysilicon layer 36. In this alternative, the reverse biased P/N junction is formed between layers 36 and 28.

Figure 6:
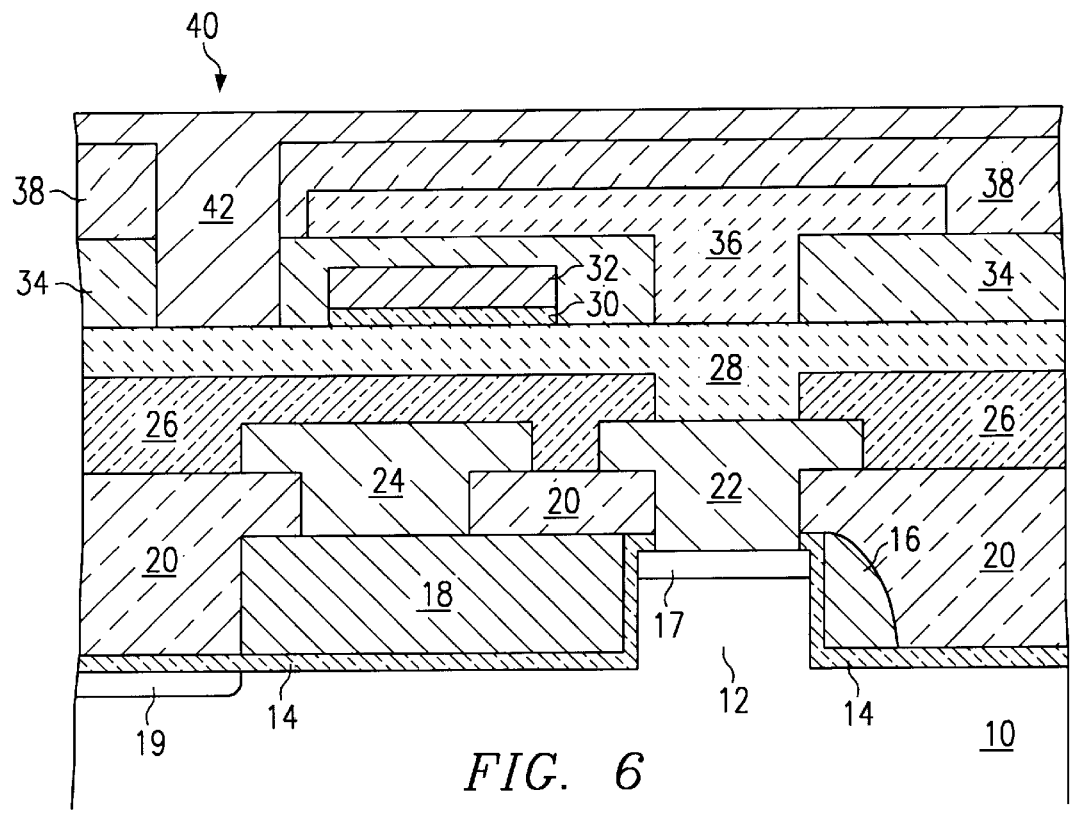

Referring to FIG. 6, a conductive layer 42 is formed over the dielectric layer 38 and in the opening 40. Conductive layer 42 is preferably a metal such as aluminum or a refractory metal such as titanium or tungsten. Conductive layer 42 forms a contact to the source drain region 28 of the thin film transistor.

Figure 7:
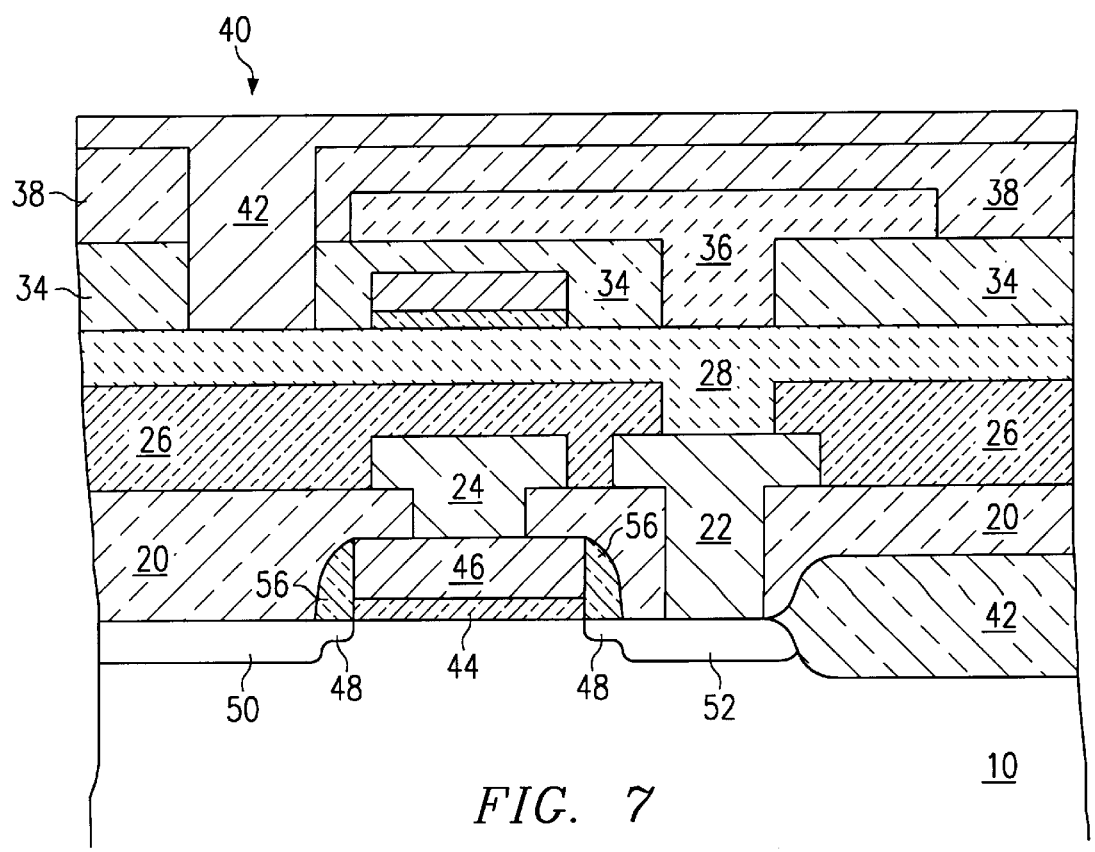

Another alternative to the above described invention is shown in FIG. 7. An integrated circuit is to be formed on a silicon substrate 10. A field oxide region 42 is formed over a portion of the substrate 10. A planar transistor is formed instead of the above described surrounding gate transistor. The planar transistor comprises gate electrode 46 which is formed over gate oxide 44. The planar transistor is formed by conventional methods as known in the art. To achieve the vertical orientation of the memory cell, the process steps at this point follow those steps described above. The interconnect 22 is formed over the source/drain region 52. A portion of the P-type source/drain region 28 of the thin film transistor or pass gate is formed over the interconnect 22. The N-type polysilicon layer 36 is formed over the source/drain region 28 which is formed over the interconnect 22. Although the surrounding gate transistor achieves greater space savings than the planar transistor, the vertical orientation of the cell using the planar transistor utilizes less surface area than a conventional planar memory cell.

Figure 8:
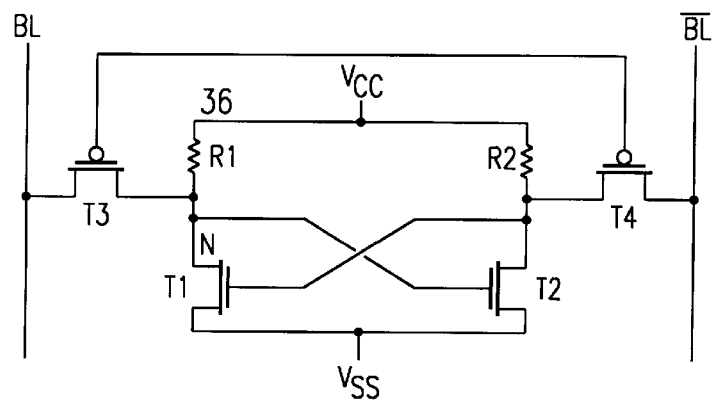
FIG. 8 illustrates an electrical diagram of a memory cell of the present invention.

Referring to FIG. 8, an electrical diagram is shown to illustrate the present invention. The active region 19 acts as a plate providing the Vss power supply. The T1 transistor is the surrounding gate transistor. In the preferred embodiment, T1 has an N-type source/drain region connected to the P-type source/drain region of the T3 thin film transistor or pass gate. The upper N-type polysilicon layer 36 shown in FIG. 6 forms a contact to the P-type source/drain region of T3. Layer 36 provides the Vcc power supply and forms the reverse biased diode between layer 36 and the source/drain region T3, shown as 28 in FIG. 6, which may act as a resistive load device R1. The gate electrode 18 of T1 will connect outside the plane of the drawing to the source/drain region of another thin film transistor T4. In other words, FIG. 6 will be duplicated elsewhere on the chip to provide, for example, the connection of the gate electrode through the interconnect (shown as 24 in FIG. 3) to the source/drain region of the thin film transistor or pass gate T4. The conductive layer 42 which contacts the source/drain region of the thin film transistor T3 through opening 40 (shown in FIG. 6) will provide one of the data bit lines (BL) to the memory cell.

The vertical orientation of the memory cell wherein the resistive load device is disposed over the source/drain of the thin film transistor or pass gate T3 which is disposed over the source/drain of the n-channel transistor T1, offers a substantial reduction in the area required to form the memory cell while at the same time maintaining the desired functions of the circuit. In addition, the pass gate T3 and the resistive load device utilize much of the same surface area as the surrounding gate transistor T1. The surface area required to build this cell can save up to possibly as much as 40 to 50 percent over its planar counterpart.

While the invention has been particularly shown and described with reference to a preferred embodiment, it will be understood by those skilled in the art that various changes in form and detail may be made therein without departing from the spirit and scope of the invention.

What is claimed is:

1. A method of forming a portion of a memory cell of a semiconductor integrated circuit; comprising the steps of:
    forming a first transistor over a portion of a silicon substrate wherein the first transistor has a source/drain region;
    etching the silicon substrate before forming the first transistor to form a pillar, wherein the first transistor is adjacent to and within the pillar and the substrate;
    forming a first dielectric layer over the substrate and the first transistor, wherein the first dielectric layer has a first and a second opening exposing a portion of the source/drain region and a portion of a gate electrode of the first transistor, respectively;
    forming a first and second interconnect region over a portion of the first dielectric layer and in the first and second openings;
    forming a second dielectric layer over the first and second interconnects and the first dielectric layer, wherein the second dielectric layer has a third opening exposing a portion of the second interconnect;
    forming a second transistor over the second dielectric layer and in the third opening;
    forming a third dielectric layer over the second transistor, wherein the third dielectric layer has a fourth opening exposing a portion of source and drain regions of the second transistor disposed over the second interconnect; and
    forming a first conductive layer over the third dielectric layer and in the fourth opening.

2. The method of claim 1, wherein the first transistor is planar and wherein the source/drain region of the first transistor is in the substrate.

3. The method of claim 1, wherein the first transistor comprises an n-channel transistor and the first and second interconnects are N-type doped polysilicon.

4. The method of claim 1, wherein the first transistor comprises a p-channel transistor and the first and second interconnects are P-type doped polysilicon.

5. The method of claim 1, wherein the second transistor comprises a p-channel transistor and the first conductive layer is N-type doped polysilicon.

6. The method of claim 1, wherein the second transistor comprises a p-channel transistor and wherein the first conductive layer comprises a P-type doped upper portion and an N-type doped lower portion of polysilicon in the fourth opening.

7. The method of claim 7, wherein the second transistor comprises an n-channel transistor and wherein the first conductive layer is P-type doped polysilicon.

8. The method of claim 1, wherein the second transistor comprises an n-channel transistor and wherein the first conductive layer comprises an N-type doped upper portion and a P-type doped lower portion of polysilicon in the fourth opening.

9. A method of forming a portion of a memory cell of a semiconductor integrated circuit; comprising the steps of:
    etching a silicon substrate to form a pillar;
    forming a first transistor over a portion of the substrate adjacent to and within the pillar and the substrate;
    forming a first dielectric layer over the substrate and the first transistor, wherein the first dielectric layer has a first and a second opening exposing a portion of the pillar and a portion of a gate of the first transistor, respectively;
    forming a first and a second interconnect region over a portion of the first dielectric layer and in the first and second openings;
    forming a second dielectric layer over the first and second interconnects and the first dielectric layer, wherein the second dielectric layer has a third opening exposing a portion of the first interconnect;
    forming a second transistor over the second dielectric layer and in the third opening;
    forming a third dielectric layer over the transistor, wherein the third dielectric layer has a fourth opening exposing a portion of source and drain regions of the second transistor disposed over the pillar; and forming a first conductive layer over the third dielectric layer and in the fourth opening.

10. The method of claim 9, further comprising the steps of:

forming a fourth dielectric layer over the first conductive layer and the third dielectric layer;

etching a fifth opening in the third and fourth dielectric layers to expose a portion of one of the source and drain regions of the second transistor; and forming a second conductive layer over the fourth dielectric layer and in the fifth opening.

11. The method of claim 10, wherein the second conductive layer comprises a metal layer.

12. The method of claim 9, wherein the step of forming the first transistor comprises the following steps:

forming a first gate oxide layer over the integrated circuit;

forming a first N-type polysilicon layer over the gate oxide layer;

patterning and etching the first polysilicon layer to form a first gate electrode exposing the pillar and a portion of the substrate; and implanting the pillar and the substrate with an N-type dopant to form N-type source and drain regions.

13. The method of claim 12, wherein the first and second interconnects are implanted with an N-type dopant to form an ohmic contact to the pillar and first transistor.

14. The method of claim 9, wherein the step of forming the second transistor comprises the steps of:

forming a second N-type polysilicon layer over the second dielectric layer and in the third opening;

forming a second gate oxide layer over the second polysilicon layer;

forming a third polysilicon layer over the second gate oxide layer;

etching the third polysilicon layer to form a second gate electrode; and implanting the second and third polysilicon layers with a P-type dopant, wherein the second polysilicon layer comprises source and drain and channel regions of the second transistor and wherein the channel region remains N-type after the P-type dopant is implanted.

15. A method of forming a portion of a memory cell of a semiconductor integrated circuit; comprising the steps of:

etching a silicon substrate to form a pillar;

forming a first gate oxide layer over the substrate and the pillar;

forming a first polysilicon gate electrode of a first transistor over a portion of the gate oxide adjacent to the pillar;

implanting a dopant into the gate electrode, the pillar and the substrate, to form first source and drain regions of the first transistor in the substrate and pillar;

forming a first dielectric layer over the substrate, the first gate and pillar wherein the first dielectric layer has a first and a second opening therethrough exposing a portion of the pillar and the first gate, respectively;

forming a polysilicon interconnect region in the first and the second opening;

forming a second dielectric layer over the interconnect region and the first dielectric; wherein the second dielectric has a third opening therethrough exposing a portion of the polysilicon interconnect region disposed over the pillar;

forming a first polysilicon layer over the second dielectric layer and in the third opening;

forming a second gate oxide and second polysilicon gate of a second transistor over a portion of the first polysilicon layer;

implanting a dopant into the first polysilicon layer, wherein the first polysilicon layer forms a source, a drain and a channel region of the second transistor;

forming a third dielectric layer over the second polysilicon gate and first polysilicon source/drain region having a fourth opening therethrough exposing a portion of the first polysilicon source/drain region disposed over the pillar; and forming a second polysilicon layer over a portion of the third dielectric layer and in the fourth opening.

16. The method of claim 15, wherein the first polysilicon gate electrode, pillar and a portion of the substrate is implanted with an N-type dopant to form an n-channel transistor.

17. The method of claim 15, further comprising the steps of:

forming a fourth dielectric layer over the second polysilicon layer and the third dielectric layer;

forming a fifth opening in the fourth dielectric layer and the third dielectric exposing a portion of the first polysilicon layer; and forming a conductive layer over the fourth dielectric layer and in the fifth opening.

18. The method of claim 17, wherein the conductive layer comprises a metal.

19. The method of claim 16, wherein the polysilicon interconnect region is N-type.

20. The method of claim 15, wherein the first polysilicon layer and the second polysilicon gate are implanted with an N-type dopant.

* * * * *